United States Patent [19]
Thome et al.

[11] Patent Number: 5,809,549
[45] Date of Patent: *Sep. 15, 1998

[54] BURST SRAMS FOR USE WITH A HIGH SPEED CLOCK

[75] Inventors: Gary W. Thome; Michael J. Collins, both of Tomball, Tex.

[73] Assignee: Compaq Computer Corp., Houston, Tex.

[*] Notice: The term of this patent shall not extend beyond the expiration date of Pat. No. 5,604,884.

[21] Appl. No.: 801,738

[22] Filed: Feb. 14, 1997

Related U.S. Application Data

[63] Continuation of Ser. No. 034,288, Mar. 22, 1993, Pat. No. 5,604,884.
[51] Int. Cl.⁶ .................................................. G06F 13/28
[52] U.S. Cl. ........................... 711/167; 395/556; 395/559
[58] Field of Search ................... 395/494, 432, 395/550, 556, 559; 365/233; 711/105, 167

[56] References Cited

U.S. PATENT DOCUMENTS

| | | | |
|---|---|---|---|
| 4,618,947 | 10/1986 | Tran et al. | 365/236 |
| 5,210,845 | 5/1993 | Crawford et al. | 711/128 |
| 5,587,954 | 12/1996 | Vogley et al. | 365/221 |

*Primary Examiner*—Tod R. Swann
*Assistant Examiner*—Kevin L. Ellis
*Attorney, Agent, or Firm*—Sharp, Comfort & Merrett, P.C.

[57] ABSTRACT

Burst SRAMs designed for operation at a given data rate corresponding to the frequency of a first clock signal but capable of operation using a higher frequency clock signal. The burst SRAMs are preferably incorporated into the cache memory of a second level cache coupled to the processor bus in a computer system, where the computer system is preferably based on a 66-MHz P5 microprocessor. A cache controller, preferably incorporated within a memory controller, controls operation of the second level cache memory by providing the address load and address advance signals. The burst SRAMs are capable of recognizing the faster clock pulses, as well as the shorter pulses asserted on the address load and address advance signals. The address control signals are asserted and then negated during consecutive clock cycles of the faster clock signal, so that the burst SRAMs effectively operate at the same data rate corresponding to the lower frequency clock signal.

24 Claims, 6 Drawing Sheets

BURST SRAMS FOR USE WITH A HIGH SPEED CLOCK

This is a continuation of application Ser. No. 08/034,288 filed Mar. 22, 1993, now U.S. Pat. No. 5,604,884.

BACKGROUND OF THE INVENTION

1. Field of the Invention

The present invention relates to burst SRAMs designed to operate at a given data rate corresponding to a first clock signal on a second, faster clock signal.

2. Description of the Related Art

The consumers constantly demand faster and more powerful computers from the computer industry. A major bottleneck in computer speed has historically been the speed with which data can be accessed from memory, where this speed is referred to as the memory access time. The microprocessor, with its relatively fast processor cycle times, has generally had to wait during memory accesses to account for the relatively slow memory devices. Therefore, improvement in memory access times has been one of the major areas of research in enhancing computer performance.

In order to bridge the gap between fast processor cycle times and slow memory access times, cache memory was developed. A cache is a small amount of very fast, expensive, preferably zero wait state memory that is used to store a copy of frequently accessed code and data from system memory. The microprocessor can operate out of this very fast memory and thereby reduce the number of wait states that must be interposed during memory accesses.

The i486 microprocessor by the Intel Corporation (Intel) uses a 32-bit data path and includes a version which operates with 33 or 50 MHz clocks. The C5 or cache controller and compatible C8 or 82490 cache static random access memories (SRAMs) are designed for use with the i486 microprocessor to provide a relatively high performance microprocessor/cache system operating at 33 or 50 MHz. Another memory chip compatible with the i486 microprocessor is the MCM62486A 32 k×9 BurstRAM synchronous SRAM from Motorola, Inc., which is designed for use in a burstable, high performance, secondary level cache for the i486 microprocessor. This particular burst SRAM was designed to operate with a 33 MHz clock.

The P5 or Pentium microprocessor from Intel is a next generation microprocessor offering very high performance features, including superscaler architecture and integrated and separate code and data caches. One version of the P5 operates at a clock speed of 66 MHz and uses a full 64-bit data path, thereby providing significant performance improvements over the 32-bit, 33 MHz i486 microprocessor. Intel provides a C5C cache controller with corresponding C5C SRAMs, which provides an optimal second level cache system for use with the P5 microprocessor. The C5C cache controller and C8C SRAMs, however, are very costly. Furthermore, other design considerations and limitations involved in the use of the C5C and C8C cache combination make other alternatives more attractive, especially from the standpoint of simplicity, convenience and cost.

Standard SRAMs typically operate at 60 to 80 nanoseconds (ns), and thus are not capable of keeping up with the desired transfer rate of cache memory subsystems associated with the P5 microprocessor. Burst SRAMs capable of operating at less than 30 ns corresponding to a 33 MHz clock are desirable for use with the P5 microprocessor to prevent excessive wait states.

It is desirable to use a 66 MHz version of the P5 microprocessor in conjunction with faster burst SRAMs designed for use with 33 MHz clock speeds, primarily for cost and simplicity reasons. For proper operation in systems using a microprocessor operating at a faster speed than memory devices, however, it is typical to provide extra clock and synchronization circuitry for receiving the faster clock and dividing it down to a slower clock for use by slower memory devices. The synchronization circuitry must insert delays so that the memory devices are synchronized to the slower clock. For example, it is desirable that every rising edge of the slower clock correspond with every other rising edge of the faster clock in a two clock system. The faster logic, such as the CPU, may initiate operations on any rising edge of the fast clock. However, logic operating off the slower clock speed must initiate operations upon the rising edge of its slower clock. This results in substantial additional delays in a synchronized system, since the microprocessor may initiate a cycle on an "odd" clock cycle, where the slower devices must wait for the rising edge of the slower clock.

It is desirable, therefore, to avoid the expense and delays of additional clock and synchronization circuitry associated with generating and synchronizing a slower clock signal from the system clock for use by slower memories.

SUMMARY OF THE PRESENT INVENTION

In a computer system according to the present invention, a second level cache system is provided using burst SRAMs designed to operate at a given data rate associated with a first clock, where certain portions of the burst SRAMs are capable of proper operation using a faster clock signal but the data cycle time is still referenced to the lower rate clock. The timing of the registers within the burst SRAMs are upgraded to recognize the shorter pulses of the fast clock and control signals, although the internal memory array is not changed. The raw data rate remains unchanged, but additional clock and synchronization circuitry are unnecessary since only one primary fast clock signal is required.

Typical burst SRAMs are designed to receive several control signals, including an address load signal to initiate a burst cycle, and an address advance signal used to increment the internal address of the RAM to continue the burst cycle. A cache controller is provided to assert the address load and address advance signals to receive only those clock edges of the fast clock corresponding to a rate at least as slow as the slower clock. Thus, only one fast clock signal is required.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
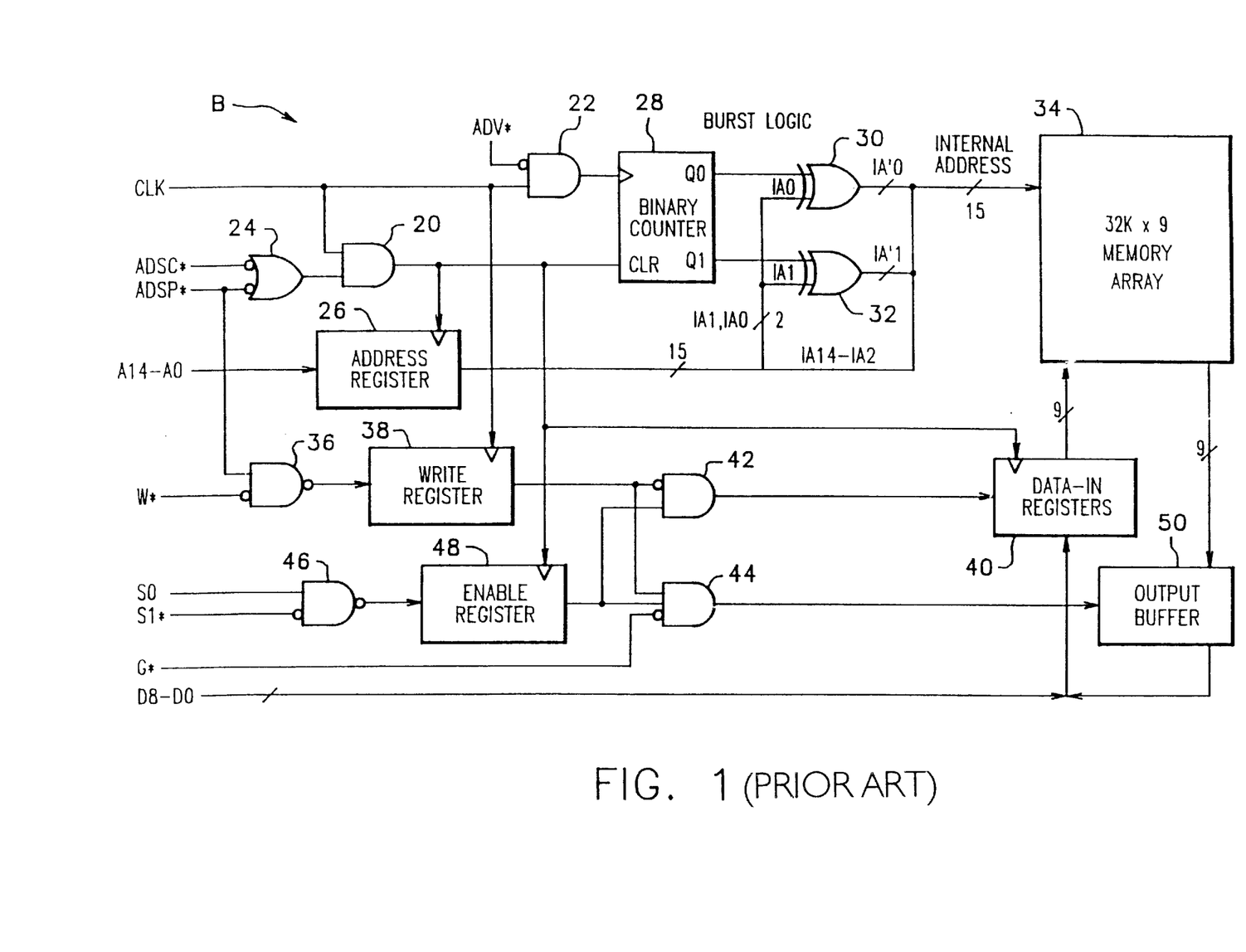
FIG. 1 is a block diagram of a burst SRAM according the present invention.

Referring now to FIG. 1, a schematic block diagram is shown of the internal portions of a 32 k×9 burst SRAM B according to the present invention. It is noted that the basic logic portions of the block diagram are not changed from prior art, except that certain timing parameters are modified to allow the burst SRAM B to operate using a faster clock signal. The illustrated logic is that of the MCM62486A from Motorola. As described below, the modified burst SRAM B will operate in a similar manner with a slower clock, and will be used with a slower clock to illustrate operation of prior art burst SRAMs. A clock signal CLK is provided to one input of a two-input AND gate 20, to one input of another two-input AND gate 22 and to the clock inputs of a write register 38 and a data-in register 40. An address advance signal ADV* is provided to an inverted input of the AND gate 22, which has its output connected to the clock input of a binary counter 28. An asterisk at the end of a signal name denotes negative logic, where the signal is true when asserted low. An address status cache controller signal ADSC* and an address status processor signal ADSP* are provided to the two inverted inputs of a two-input OR gate 24. Thus, the output of the OR gate 24 is high when either of the ADSC* or the ADSP* signals are asserted low. The ADSC* signal is used as the address load signal and the ADV* signal is used as the address advance signal.

The output of the OR gate 24 is provided to the other input of the AND gate 20, which has its output connected to a clear input of the binary counter 28, to the clock input of an address register 26 and to the clock input of an enable register 48. The address register 26 receives address bits A14-A0, which are typically connected to a portion of the processor bus in a computer system when the burst SRAM B is used for cache memory. The output of the address register are internal address bits IA14-IA0. The address bit IA0 is provided to one input of a two-input exclusive OR gate 30 and the IA1 address bit is provided to one input of another two-input exclusive OR gate 32. The least significant bit (LSB) output of the binary counter 28 is provided to the other input of the exclusive OR gate 30, and the most significant bit (MSB) of the binary counter 28 is provided to the other input of the exclusive OR gate 32. The address bits IA14-IA2 from the address register 26 are provided to the upper 13 address bits of an internal 32K×9 memory array 34 provided within the burst SRAM B. The output of the exclusive OR gate 30 is an address bit IA'0 provided to bit 0 of the address input of the memory array 34, whereas the output of the exclusive OR gate 32 provides an address bit IA'1 to the bit 1 address input of the memory array 34. The signals IA14-IA2, IA'1, IA'0 form an internal address of the burst SRAM B. When the binary counter 28 is clocked, the IA'0 and IA'1 bits are used to increment the internal address.

The ADSP* signal is provided to one input of a two-input NAND gate 36, which has an inverted input connected to a signal W*. The output of the NAND gate 36 is provided to the input of the write register 38, which has its output connected to the inverted input of a two-input AND gate 42 and to a non-inverted input of a three-input AND gate 44. A first chip select input signal S0 is connected to the non-inverted input of a two-input AND gate 46 and another chip select input signal S1* is connected to the inverted input of the AND gate 46, which has its output connected to the input of the enable register 48. The output of the enable register 48 is provided to the non-inverted input of the AND gate 42 as well as a second non-inverted input of the AND gate 44. The inverted input of the AND gate 44 is connected to an output enable input signal G*.

The output of the AND gate 42 is connected to the enable input of data-in registers 40, which receive the D8-D0 data bits. The data-in registers 40 have outputs connected to the data inputs of the memory array 34. The output of the AND gate 44 is provided to the enable input of an output buffer 50, which receives the data output of the memory array 34 at its input, and has its output connected to the D8-D0 data bits.

The operation of the burst SRAM B will be described as used in the memory portion of a second level cache subsystem. An array or matrix of burst SRAMs similar to the burst SRAM B would preferably be used to comprise the cache memory for the second level cache. The particular configuration would depend on the width of the data bus and the amount of memory desired. The S0 and S1* signals are assumed asserted for simplicity. The clock input CLK is preferably connected to the processor clock. A cache controller (not shown) provides an address load signal to the ADSC* signal input, an address advance signal to the ADV* signal input, an output enable input signal to the G* signal input and a read/write signal to the W* signal input. A microprocessor would typically provide the ADSP* signal. The address bits A14-A0 and data bits D8-D0 are connected to corresponding portions of the processor bus, although D8 is usually a parity bit for the data bits D7-D0.

The ADSC* signal is asserted low, causing the address register 26 to be clocked on the rising edge of the CLK signal, strobing in an address from the processor address bus to the memory array 34. The enable register 48 and the write register 38 are also clocked, thus effectively enabling the AND gates 42 or 44 depending upon the W* and G* signals. If the ADV* signal remains negated high, the binary counter 28 is not clocked so that the IA'0 and IA'1 address bits mirror the IA0 and IA1 address bits, where the address indicated from the processor bus is provided directly to the memory array 34. If a write cycle is indicated by the W* signal asserted low, the data-in registers 40 are enabled so that the data from the processor bus is provided to the memory array 34. If a read cycle is indicated, data from the memory array 34 is provided to the input of the output buffer 50, which is then provided to the processor bus when the G* signal is asserted low.

The memory array 34 essentially defines the data rate for both the data read and write cycles. Thus, even though an address is provided early, the data is not fully stored in a write cycle, or is not valid for a read cycle, until enough time has elapsed as specified by the manufacturer.

Eventually, read data becomes valid for assertion on the processor bus, or write data is accepted by the memory array 34 from the data-in registers 40. The ADV* signal is then asserted low so that the binary counter 28 is clocked on the subsequent rising edge of the CLK signal clocking the binary counter 28 causes the internal address to be incremented to point to the next consecutive address location of the memory array 34. While the ADV* signal remains asserted low, subsequent rising edges of the CLK signal clock the binary counter 28, thereby incrementing the internal address to the memory array 34. After the last rising edge of the CLK signal in a burst cycle, the ADV* signal is negated so that remaining CLK cycles are ignored. It is noted that the ADV* signal may be negated during the burst cycle to ignore the CLK signal, thus suspending operation. The ADV* signal would then be asserted low to complete the burst cycle.

The block diagram shown in FIG. 1 is substantially the same for burst SRAMs of prior art. Only the timing is changed. Effectively, the binary counter 28 and the registers 26, 38, 40 and 48 are designed to be capable of receiving faster clock and control pulses for latching the data, such as those occurring with a 66 MHz pulse having high and low times of approximately 7 ns. The primary speed of the memory array 34 remains substantially unchanged, in the preferred embodiment 20 or 25 ns conforming to an effective 33 MHz data rate.

Figure 2A:
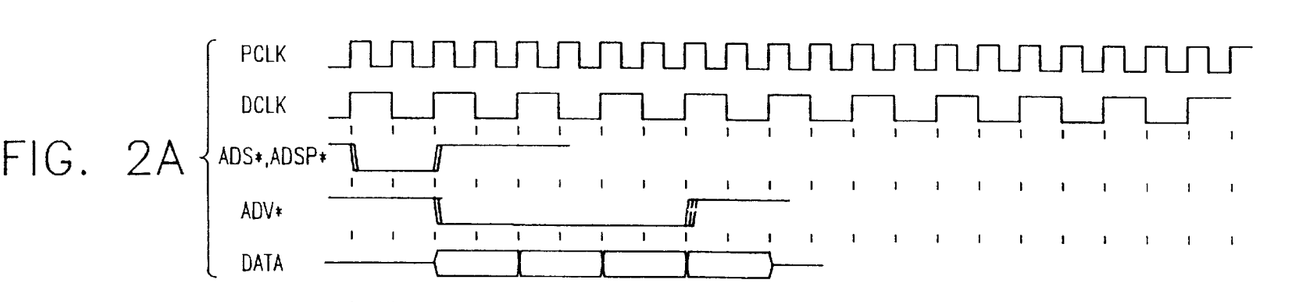
FIG. 2A is a timing diagram illustrating operation of burst SRAMs in a lower frequency system using a lower frequency clock.

Referring now to FIG. 2A, a timing diagram is shown illustrating operation of the burst SRAM B operating at its normal clock rate, which is preferably 33 MHz. It is noted that although the burst SRAM B is capable of receiving a faster clock, it uses a slower clock to demonstrate the operation of prior art burst SRAMs. In a typical embodiment, a microprocessor, such as the i486 microprocessor by Intel, includes an ADS* output signal to initiate the beginning of a read/write cycle. The burst SRAM B is specifically designed for use with the i486 microprocessor so that the ADS* signal from the processor bus is tied directly to the ADSP* signal. A separate cache controller (not shown) would be provided and connected to the clock, the ADS* signal, the address bus and other control signals of the i486 microprocessor, where the cache controller would provide the ADSC*, W*, C* and ADV* signals to the burst SRAM B.

As shown in FIG. 2A, a first clock signal PCLK is shown which preferably operates at a rate of 66 MHz, where a rising edge occurs at times T0, T2, T4, T6, T8 and so on. A second, slower clock signal referred to as DCLK, operates at half the speed of the PCLK signal or 33 MHz, so that a rising edge occurs at times T0, T4, T8, T12 and so on. It is understood that although the clock frequencies illustrated are different by a factor of two, the present invention may be practiced with a high frequency clock signal at any integer factor of the slow clock frequency, as long as the burst SRAM B is capable of detecting the shorter pulses. A factor of two is used for purposes of simplicity.

In a typical burst SRAM used in conjunction with an i486 microprocessor, the 33 MHz clock signal DCLK signal is used for all operations. After a slight delay from time T0, the ADS* signal is asserted low and remains low for approximately a full DCLK signal clock cycle. The ADS* signal is detected asserted low at the rising edge of the DCLK signal at time T4. Thus, at time T4, the burst SRAM has sampled the address from the processor address bus and begins to assert the corresponding data after a slight delay from time T4. The ADV* signal is also asserted low after a delay from time T4 in order to internally advance the address during the burst cycle. The ADV* signal remains asserted low for approximately three DCLK signal cycles during the burst read cycle if the burst read cycle continues uninterrupted. Thus, one DCLK signal cycle later at a time T8, the rising edge of the DCLK signal is sampled by the binary counter 28 and the internal address is incremented. After a slight delay from time T8, new data is asserted from the burst SRAM onto the processor data bus.

One DCLK signal cycle after time T8 at a time T12, the ADV* signal is still asserted low so that the rising edge of the DCLK signal is detected by the binary counter 28 at time T12. Again, the internal address is incremented so that new data is asserted a short delay period after time T12. Approximately one cycle of the DCLK signal later, at time T16, the ADV* signal remains asserted so that the rising edge of the DCLK signal is detected at time T16, thereby incrementing the internal address of the burst SRAM B again. The fourth set of data is subsequently asserted onto the processor data bus, which is the last set of data in the burst read cycle. The ADV* signal is negated after time T16 to prevent latching any further addresses from the processor address bus unless another cycle is pending. The duration of the burst read cycle from assertion of the ADS* signal until the last data segment is provided is between 5 and 6 DCLK signal cycles in a 33 MHz system.

Figure 2B:
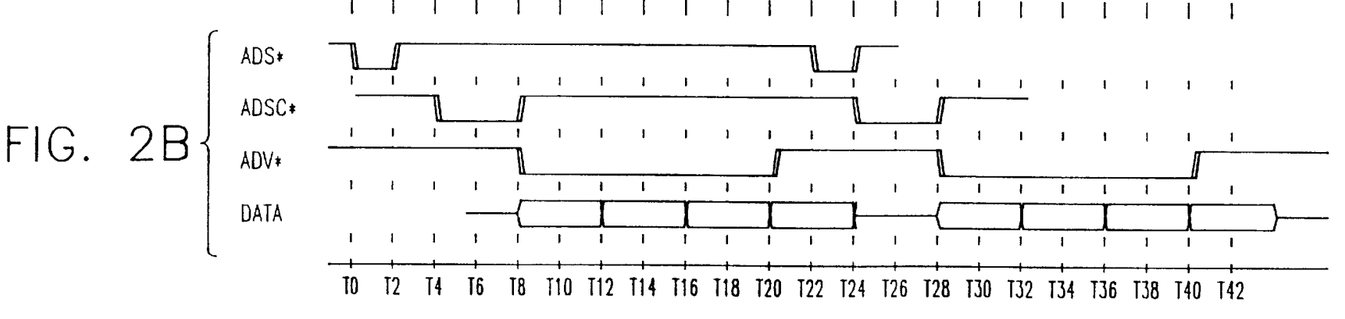
FIG. 2B is a timing diagram illustrating operation of burst SRAMs using a lower frequency clock in a dual clock system.

Referring now to FIG. 2B, the same burst SRAM B used for FIG. 2A is used except in a system incorporating a faster processor, such as the P5 microprocessor from Intel, which preferably operates at 66 MHz. Separate clock and synchronization circuitry (not shown) must be provided to receive the PCLK signal and provide the DCLK signal in order to operate the burst SRAMs of prior art, since they may only operate at a slower clock frequency. The synchronization portion may be provided in a cache controller since a cache controller would typically be required to operate the cache memory. The clock and synchronization circuitry must perform synchronization and clock delaying operations, since the pulses provided from the faster microprocessor may not be provided directly to the burst SRAMs. The clock circuitry must provide appropriate delay in case operation of the faster logic is initiated on an "odd" PCLK signal cycle relative to the DCLK signal. The ADS* signal may not be directly tied to the burst SRAMs since they are unable to operate with the faster pulses. In this case, the ADSP* signal is pulled high and the ADSC* signal is used to load or strobe in the data.

In FIG. 2B, the microprocessor asserts the ADS* signal at approximately time T0, where the ADS* signal is negated approximately one PCLK signal cycle later at time T2. The clock and synchronization logic detects the ADS* signal asserted and asserts the ADSC* signal at time T4. The clock circuitry asserts the ADSC* signal for a duration of about one DCLK signal cycle between time T4 and time T8. The clock circuitry then asserts the ADV* signal at approximately time T8 in a similar manner as shown in FIG. 2A, where the ADV* signal remains asserted for approximately 3 DCLK signal cycles to time T20. Data segments are shown asserted on the data bus processor beginning at time T8 and ending at time T24. Although the cycle operates substantially the same as that shown in FIG. 2A for an i486 microprocessor system, the entire burst read cycle is stretched for one DCLK signal cycle since the ADS* signal is not provided directly to the burst SRAM, and the cycle was initiated on an "odd" PCLK signal cycle not corresponding to the rising edge of the DCLK signal.

Even if the microprocessor asserts its ADS* signal to begin a new cycle at an even PCLK signal cycle relative to the DCLK signal, one PCLK signal cycle delay is still necessary to properly synchronize the burst SRAMs with its slower clock signal. As shown in FIG. 2B, the ADS* signal is again asserted at approximately time T22, which corresponds with a falling edge of the DCLK signal. The clock and synchronization circuitry asserts the ADSC* signal at time T24, which occurs one PCLK signal cycle sooner than the first burst cycle. Thus, the ADSC* signal remains asserted until after time T28, approximately one DCLK signal cycle later. After a short delay from time T28, the ADV* signal is asserted low and remains asserted until approximately time T40, when the last DCLK signal rising edge is sampled, incrementing the address as described previously. Thus, the cycle operates in a very similar manner as the first case shown in FIG. 2B except that one PCLK signal cycle of delay is saved. In either case, the entire burst read cycle is at least one PCLK signal cycle longer in duration than that for the i486 system due to synchronization required in a two-clock system.

Figure 3:
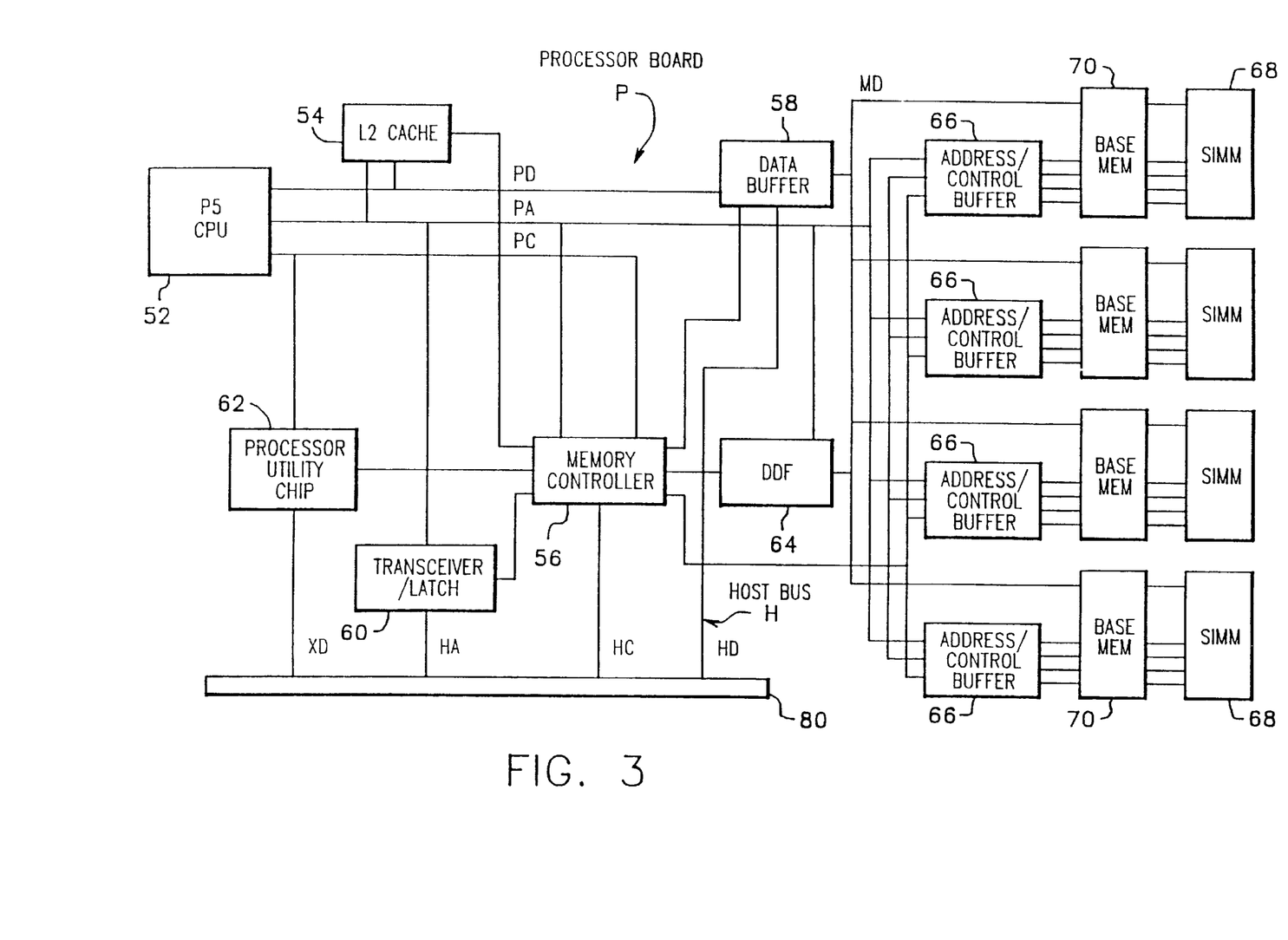
FIG. 3 is a block diagram of the processor board of a computer system according to the preferred embodiment.

Referring now to FIG. 3, a block diagram of a processor board P implemented according to the present invention is shown. The remaining system and I/O portions of the computer system are not necessary for full disclosure of the present invention, and thus are not shown or described for purposes of simplicity. The primary component on the processor board P is a central processing unit (CPU) 52, which is preferably the P5 microprocessor from Intel. Three buses are connected to the CPU 52, including the PD or processor data bus, the PA or processor address bus and the PC or processor control bus. A second level cache memory, otherwise referred to as the L2 cache 54, is connected to the PD and PA buses and receives several control signals from a memory controller 56. In the preferred embodiment, the memory controller 56 contains conventional memory controller functions and additionally includes the cache controller capabilities necessary for interfacing the L2 cache 54.

A data buffer 58 is connected to the PD bus and develops two new buses, the HD or host data bus and the MD or memory data bus. The HD bus is part of a host bus H, and is connected to a connector 80 for connection to the system board (not shown) of the computer system. The data buffer 58 is controlled by the memory controller 56. A transceiver/latch unit 60 is connected between the PA bus and the HA bus to provide latching and transceiving capabilities of addresses between the CPU 52 and the host bus H. The transceiver/latch 60 is controlled by the memory controller 56. The memory controller 56 is connected to a unit referred to as the DDF or data destination facility 64. The DDF 64 performs memory module enabling, address translation and memory segment or page property storage.

A processor utility chip 62 provides certain necessary utility operations for use with the CPU 52. The processor utility chip 62 is connected to an XD bus, the host bus H and is controlled by the memory controller 56. The output of the processor utility chip 62 is preferably provided to the PC bus to provide control functions of the CPU 52.

The memory portion of the processor board P is provided as four identical modules, each module containing an address/control buffer 66, one socket for receiving an individual SIMM unit 68 and base memory 70. The address/control buffer 66 receives the PA bus, the address and enable outputs of the DDF 64 and control signals from the memory controller 56. The outputs of the address/control buffer 66 are the addresses provided to the SIMMs 68 or base memory devices 70. As indicated, there are four like modules. Other configurations of the processor board P could be developed, with variations obvious to one skilled in the art.

The CPU 52 operates in a similar manner as the i486 microprocessor, where it asserts an address status signal ADS* indicating that a new valid bus cycle is currently being driven by the CPU 52. When the ADS* signal is asserted, the CPU 52 also drives a signal M/IO* indicating whether the cycle is a memory or I/O operation, a signal W/R* indicating whether the cycle is a write or a read operation and a signal D/C* indicating a data or control cycle. The CPU 52 also asserts eight byte enable bits BE7*-BE0* indicating which bytes of the PD data bus are to be read or written by the CPU 52. In general, the cycle is terminated by an external device asserting a burst ready signal BRDY* to the CPU 52, indicating that the external device has presented valid data for a read cycle or has accepted data in response to a write request. The CPU 52, however, also supports address pipelining, which is not supported by the i486 microprocessor, where the next cycle may begin before the data phase of the previous cycle is completed. An external device asserts a next address signal NA* indicating its preparedness to begin a new cycle. The CPU 52 may thus begin a new cycle by asserting the ADS* signal before or on the same clock cycle as when the BRDY* signal is asserted.

Figure 4:
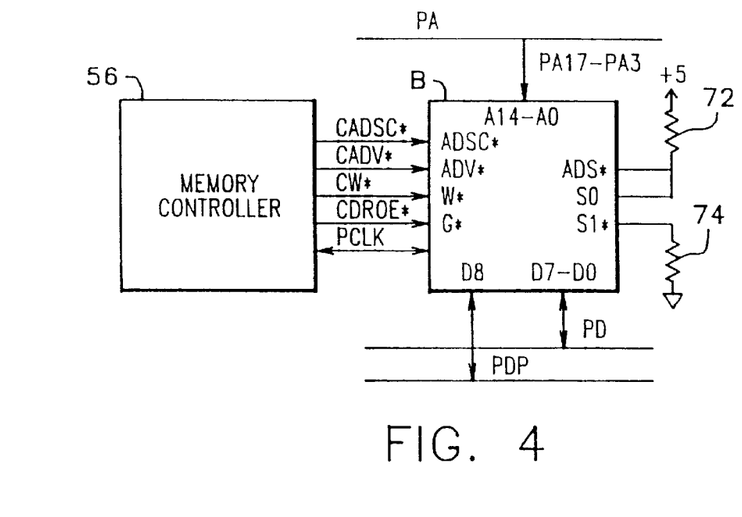
FIG. 4 is a more detailed diagram illustrating the connection between the memory controller of FIG. 3 and the burst SRAM of FIG. 1.

Referring now to FIG. 4, a more detailed schematic diagram is shown illustrating the connection between the memory controller 56 and the burst SRAM B, where the burst SRAM B is preferably one of eight similar burst SRAMs within the L2 cache 54. Preferably, the L2 cache 54 is a relatively simple 256 kbyte, direct-mapped, look aside, write-through cache for simplicity of logic and operations. The memory controller 56 provides signals CADSC*, CADV*, CW*, and CDROE* which are connected to the ADSC*, ADV*, W* and GC* signals, respectively, of the burst SRAM B. In the preferred embodiment, the CADSC* and CADV* signals actually comprise A and B versions for buffering and clock fan-out purposes, but only one signal is described for simplicity since these signals are similar in operation. The CW* signal is derived from the W/R* signal from the CPU 52 and the CDROE* signal is simply an output enable signal as known to those skilled in the art.

The PCLK signal is provided to both the memory controller 56 and the burst SRAM B. The burst SRAM B is connected to bits PA17-PA3 of the processor data bus PD. Data bit D8 is preferably a parity error bit provided to a separate processor data parity bus PDP. The ADSP* and S0 input signals are preferably pulled high through a pull-up registor 72, and the SI* input signal is preferably pulled down to ground through a pull-down resistor 74.

Figure 5:
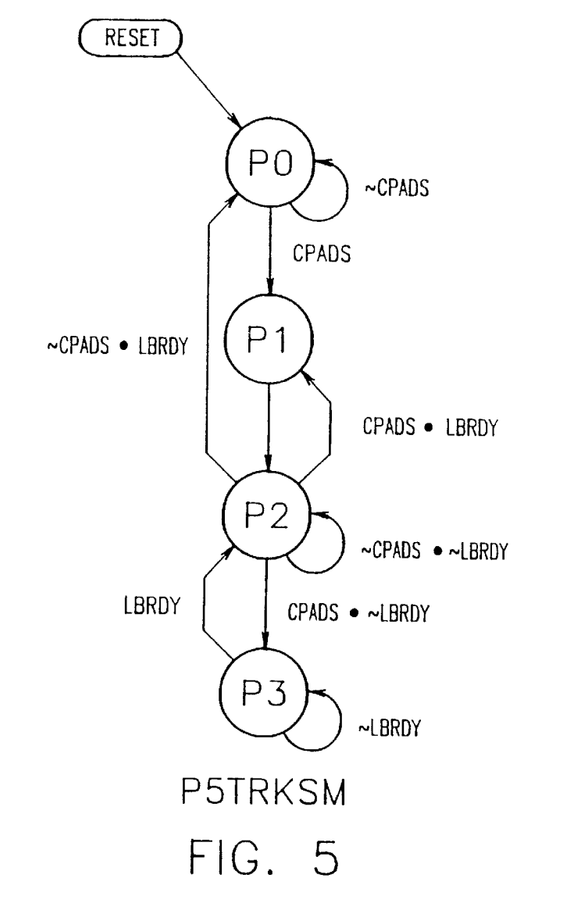
FIG. 5 is a state machine diagram of a processor tracker state machine operating in the memory controller of FIG. 4.

The logic within the memory controller 56 for performing the cache controller functions used to develop the CADSC* and CADV* signals will now be described. Referring now to FIG. 5, a state machine diagram is shown illustrating the operation of a processor tracker state machine (P5TRKSM) implemented within the memory controller 56 of FIG. 4. The P5TRKSM is advanced from one state to the next on the positive edge of the PCLK signal. Upon reset of the computer system, the P5TRKSM enters a state P0, where a signal P0 is also asserted to other state machines within the memory controller 56 during state P0. The P5TRKSM remains in state P) as long as a signal CPADS signal remains negated. A tilde sign "~" indicates logical negation. The CPADS signal is the ADS* signal which has been synchronized to the PCLK signal clock signal and inverted. When a valid cycle is initiated on the processor bus from the CPU 52, the CPADS signal is asserted and the P5TRKSM advances to state P1 upon the next rising edge of the PCLK signal. A corresponding signal P1 is asserted by the P5TRKSM during state P1. From state P1, operation advances to state P2 on the next rising edge of the PCLK signal, where a corresponding signal P2 is asserted while in state P2. The CPADS signal and a signal LBRDY determine which state the P5TRKSM advances to on the next rising edge of the PCLK signal.

The LBRDY signal depends on many other signals and corresponds to the last BRDY* signal, indicating data has been accepted or valid data is being provided for each data cycle. The following equations define the LBRDY signal:

| | | |
|---|---|---|
| LBRDY | = | PEOC · CPRDY |
| CPRDY | := | CRDY + EPBRDY |
| CRDY | = | L2CACHE_ON · P1 · MEMRD · RDHIT_A · ⁻NOCHIT · CHIT + RDHIT_C + FLUSHRDY |
| L2CACHE_ON | := | SYNC_CACHEN · CL2EN · NOCACHE | where the ":=" signal indicates a registered condition so that the signal on the left side of the equation is true when the conditions on the right side are true at the positive edge of the PCLK signal. The "+" signal indicates the logical "OR" function. It is significant to note that the LBRDY signal is asserted on the first positive edge of the PCLK signal after the PEOC and CPBRDY signals are asserted, indicating the last clock cycle of the current processor cycle. The PEOC signal indicates the end of a processor cycle and is developed by other logic in the memory controller 56. The CRDY signal is a cache ready signal and is provided one PCLK signal cycle early on memory controller 56 handled transfers.

The MEMRD signal is true when a signal PMIO indicates a memory cycle and a signal PWR indicates a read cycle. The PMIO and PWR signals are latched and inverted versions of the M/IO* and W/R* signals asserted by the CPU 52. The RDHIT_A signal indicates that a read hit state machine (RDHITSM), described below, residing within memory controller 56 is indicating read hits to the L2 cache 54 and is in the initial state. A RDHIT_C signal is provided by the RDHITSM indicating that bursted read cycles are in progress and that read hits are occurring.

The SYNC_CACHEN signal is a registered version of a signal CACHEN, which is bit 6 of a RAM setup port located at memory address 80C00002h. The CACHEN signal is also bit 2 of a processor control port, which mirrors bit 6 of the RAM setup port. The RAM setup register is used to enable a primary cache within the CPU 52 and the L2 cache 54, and also contains system status and control bits. The processor control port contains miscellaneous processor and numeric coprocessor functions. In this manner, the CACHEN signal is used to disable both caches. Thus, the L2CACHE_ON signal indicates that the L2 cache 54 is installed and enabled. The FLUSHRDY signal is asserted by a flush state machine (not shown) within the memory controller 56, where the FLUSHRDY signal is used to develop the BRDY* signal to the CPU 52 after flushing the L2 cache 54.

The P5TRKSM remains in state P2 while the CPADS and LBRDY signals remain negated. If the CPADS signal remains negated and the LBRDY signal is asserted, the state machine advances back to state P0 indicating the end of a non-pipelined cycle. If the CPADS and LBRDY signals are both asserted during state P2, indicating a pipelined cycle present and the prior cycle completing, operation advances back to state P1. If the CPADS signal is asserted while the LBRDY signal remains negated in state P2, also indicating a pipelined cycle but without completion of the prior cycle, operation proceeds to state P3, where a corresponding signal P3 is asserted. Operation remains in state P3 while the LBRDY signal is negated. When the LBRDY signal is asserted in state P3, operation advances back to state P2. Thus, the P5TRKSM essentially tracks the cycles executed by the CPU 52 to determine the start and the completion of each processor cycle.

Figure 6:
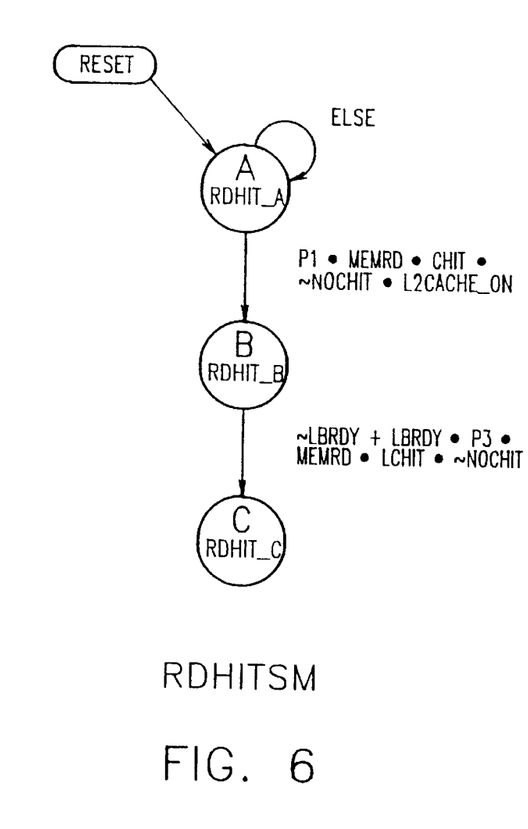
FIG. 6 is a read hit state machine operating in the memory controller of FIG. 4.

Referring now to FIG. 6, a state machine diagram is shown illustrating the operation of the RDHITSM state machine operating within the memory controller 56 of FIG. 4. The RDHITSM is simplified since several other states and other logic have been omitted as not necessary for full disclosure of the present invention. The RDHITSM is advanced on the rising edges of the PCLK signal. The RDHITSM remains in state A until a memory read occurs as indicated by the MEMRD signal, a cache hit occurs as indicated by the CHIT signal asserted and the NOCHIT signal not asserted, the L2 cache 54 is installed and enabled and the P5TRKSM state machine is in state P1. When these conditions are met, the RDHITSM advances to state B. Otherwise, the RDHITSM remains in state A as indicated by an ELSE loop. In state B, the RDHITSM asserts a signal RDHIT_B.

From state B, operation proceeds to state C if the LBRDY signal is not asserted indicating it is not the last BRDY* clock cycle in a burst, or if the LBRDY signal is asserted, a memory read is indicated, a cache hit has occurred and the P5TRKSM state machine is in state P3. A signal LCHIT is a latched version of the CHIT signal. If these conditions are not met, the RDHITSM returns to state A indicated by an ELSE branch. During state C, the RDHITSM asserts the RDHIT_3 signal, which is used to derive the CADV* signal. From state C, operation always proceeds to state B on the next rising edge of the PCLK signal.

Figure 7A:
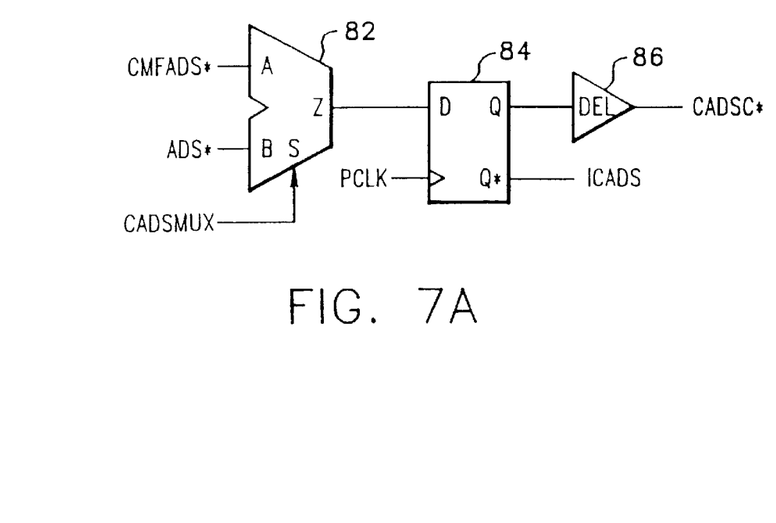
FIGS. 7A and 7B show the logic for generating control signals within the memory controller of FIG. 4.

Referring now to FIG. 7A, a schematic diagram is shown illustrating the logic used to develop the CADSC* signal. A two-input multiplexor 82 receives a signal CMFADS* at its A input and the ADS* signal at its B input. A signal CADSMUX is provided to the S select input, where the A input, or the CMFADS* signal, is provided at the Z output when the CADSMUX signal is false, and the B input, or the ADS* signal, is provided to the Z output when the CADSMUX signal is true. The Z output is provided to the D input of a D-type flip-flop 84, which receives the PCLK signal at its clock input. The Q output of the D-flip-flop 84 provides the CADSC* signal through a delay buffer 86. The Q* output provides a signal ICADS. The following equations define the state of the CMFADS* and CADSMUX signals:

| | | |
|---|---|---|
| CMFADS* | = | ⁻(P0 · CPADS · ⁻ICADS + P2 · RDHIT_C · PEOC · CPADS + P3 · RDHIT_C · PEOC + D_CADS · ⁻INH_CADS) |
| D_CADS | := | P2 · CPADS · LBRDY + P3 · LBRDY |
| INH_CADS | := | RDHIT_B · PEOC · ICADS |
| CADSMUX | = | P0 · ⁻CPADS + P2 · CPADS · (RDHIT_C + RDHIT_B) · PEOC |

According to FIG. 7A and the above equations, the ADS* signal is used to initiate an assertion of the CADSC* signal to the burst SRAM B during the next PCLK signal cycle in a non-pipelined cycle. In a pipelined cycle where the ADS* signal is asserted early, the CMFADS* signal is used instead to delay the assertion of the CADSC* signal until the previous cycle is completed.

Figure 7B:
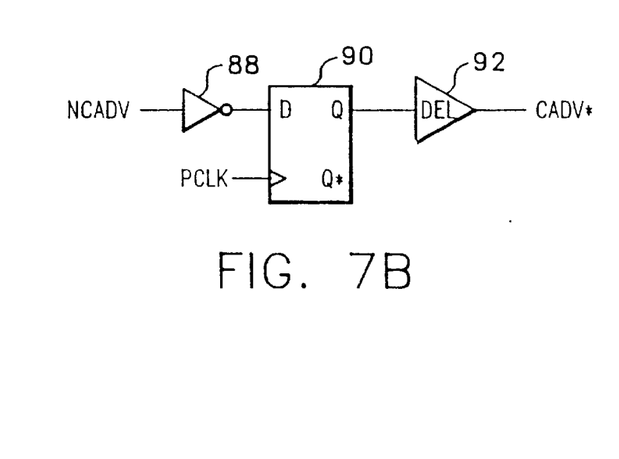

Referring now to FIG. 7B, a schematic diagram is shown illustrating the logic used to develop the CADV* signal. A signal NCADV is inverted by an inverter 88 and the inverted signal is provided to the D input of a D-type flip-flop 90. The PCLK signal is provided to the clock input of the D flip-flop 90. The Q output of the D flip-flop 90 provides the CADV* signal through a delay buffer 92. The NCADV signal is defined by the following equation:

NCADV   =   L2CACHE_ON · P1 · L2RDALLOC ·
            ‾NOCHIT · CHIT + RDHIT_C · ‾PEOC where the L2RDALLOC signal is true if a cacheable memory read is occurring and both the internal cache of the CPU 52 and the L2 cache 54 are enabled. In brief, the NCADV signal is true during a cacheable read hit cycle when the P5TRKSM is in state P1, or when the RDHITSM is in state C and the PEOC signal is not asserted. The CADV* signal is asserted during the PCLK signal cycle following the assertion of the NCADV signal.

Figure 8:
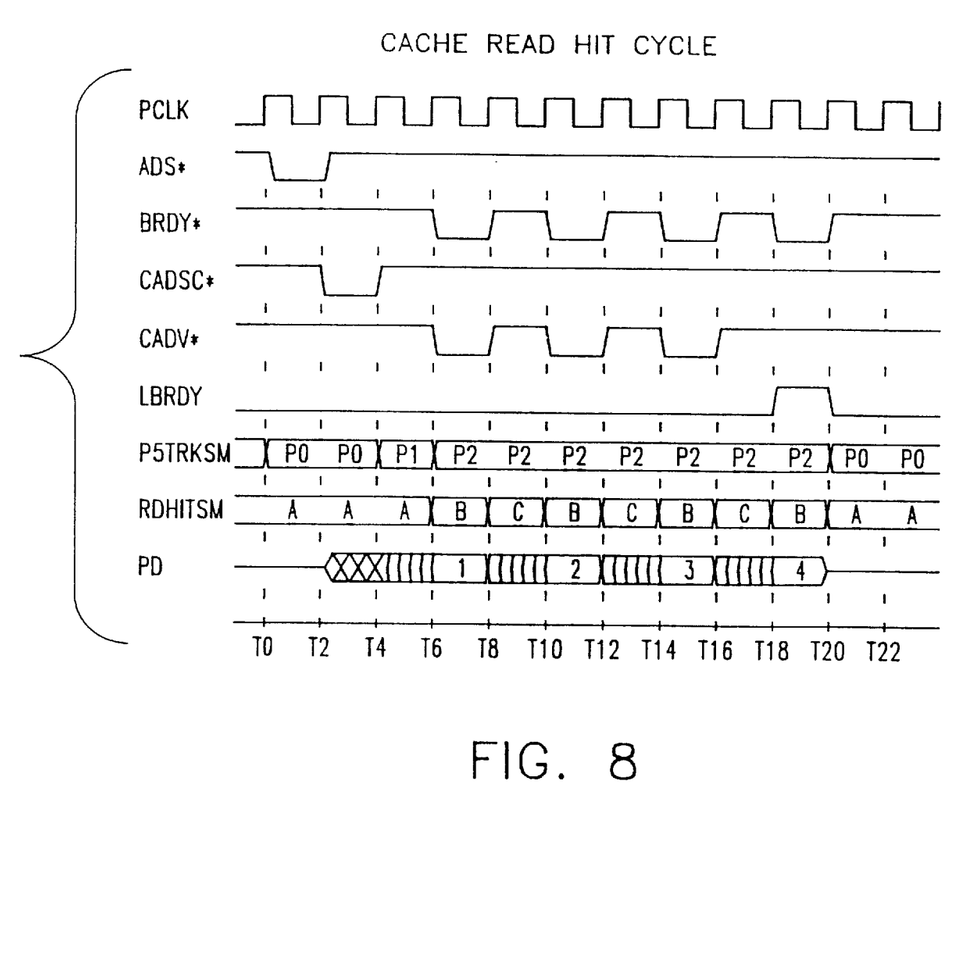
FIG. 8 is a timing diagram illustrating operation of burst SRAMs according to the present invention.

Referring now to FIG. 8, a timing diagram is shown illustrating a cache read hit cycle. Again, the PCLK signal is operating at a frequency of 66 MHz. A read hit cycle is shown to illustrate the operation of the present invention. Other types of cache cycles occur in the preferred embodiment, such as read allocate, line fills or write-back cycles, which are not shown or described for purposes of simplicity. The ADS* signal is asserted at time T0 while the P5TRKSM is in state P0 and the RDHITSM is in state A. One PCLK signal cycle later, the ADS* signal is negated and the CADSC* signal is asserted low to the burst SRAM. Again, the P5TRKSM remains in P0 and the RDHITSM machine remains in state A. On the next rising edge of the PCLK signal at time T4, the CADSC* signal is negated and the P5TRKSM is advanced to state P1, whereas the RDHITSM remains in state A. At time T6, one PCLK signal cycle later, the CADV* signal is asserted and the P5TRKSM advances to state P2 while the RDHITSM advances to state B. The BRDY* signal also is asserted synchronous with state B of the RDHITSM. The first set of data from the burst SRAM B is now available to the processor data bus PD during this PCLK signal clock cycle.

On the following rising edge of the PCLK signal at time T8, the CADV* signal is negated while the P5TRKSM remains in state P2 and the RDHITSM machine advances to state C. At time T10, the BRDY* and CADV* signals are asserted while the P5TRKSM remains in state P2 and the RDHITSM advances back to state B. At this time, the second set of data is provided on the processor bus PD for one PCLK signal cycle. At time T12, the BRDY* and CADV* signals are negated while the P5TRKSM remains in state P2 and the RDHITSM advances to state C. At time T14, the BRDY* signal and the last CADV* signal is asserted while the P5TRKSM remains in state P2 and the RDHITSM advances back to state B. At this time, the third data group becomes valid on the processor data bus PD.

At time T16, the BRDY* and CADV* signals are negated while the P5TRKSM remains in state P2 and the RDHITSM advances to state C. Also, the PEOC signal is asserted while the RDHITSM is in state C, so that the CADV* signal is not asserted during the following PCLK signal cycle. At time T18, the BRDY* and LBRDY signals are asserted, indicating the last data clock cycle of the burst cycle. The P5TPYSM remains in state P2 while the RDHITSM advances back to state B and the last set of data is provided on the processor data bus PD. The cycle ends at time T20 when the BRDY* and the LBRDY signals are negated, the P5TRKSM advances to state P0 and the RDHITSM returns to state A.

It is noted that during a burst read hit cycle, the RDHITSM advances from state A to state B to state C and alternates between states B and C on consecutive rising edges of the PCLK signal since the LBRDY signal is not asserted until the last BRDY* signal is asserted. The CADV* signal is asserted during state B and thus asserted every other clock cycle of the PCLK signal. In this manner, the CADV* signal is asserted then negated on consecutive rising edges of the PCLK signal, so that the internal address of the burst SRAM B is advanced on every other rising edge of the PCLK signal. In this manner, the burst SRAMS effectively operates at a 33 MHz rate using the 66 MHz clock. In comparison with FIGS. 2A and 2B, the duration of the cycle from assertion of the ADS* signal to the last data segment available is 10 PCLK signal cycles (equalling 5 DCLK signal cycles), which is the same rate as the burst SRAM B tied directly to the i486 microprocessor, and at least one PCLK signal cycle faster than the two clock system illustrated in FIG. 2B.

It can now be appreciated that a computer system using burst SRAMs according to the present invention may use a microprocessor operating at a higher clock frequency in conjunction with cache memory operating at a lower clock frequency without requiring the lower frequency clock signal. The burst SRAM B operates at the same data rate as used in systems using the slower clock frequency, but is capable of receiving the higher frequency clock. Cache controller logic provides the address load and advance signals corresponding to every other clock pulse of the high frequency clock, and suppressing every other clock pulse to the burst SRAM B. In this manner, additional clock generation and synchronization circuitry used to develop the slower clock is not required and the delays which necessarily result can be avoided, thus increasing system performance while allowing the use of lower cost burst SRAMs.

The foregoing disclosure and description of the invention are illustrative and explanatory thereof, and various changes in the size, shape, materials, components, circuit elements, wiring connections and contacts, as well as in the details of the illustrated circuitry and construction and method of operation may be made without departing from the spirit of the invention.

We claim:

1. A memory system for use in a computing device having a bus, the memory system providing data at a predetermined rate corresponding to a first clock signal, the memory system operating with a second, higher frequency clock signal, comprising:

a burst RAM comprising:
      a memory array adapted to receive and provide data at the predetermined data rate corresponding to the first clock signal; and
      memory array control logic coupled to the memory array and receiving an address load signal, an address advance signal and the second clock signal, the memory array control logic configured to latch an address from the bus to the memory array on an edge of the second clock when the address load signal is asserted, and to increment the address provided to the memory array on clock edges of the second clock when the address advance signal is asserted, the memory array control logic operating using the second clock signal; and
   a memory controller coupled to the burst RAM, comprising:
      bus interface logic coupled to the bus and configured to detect the start of a burst cycle on the bus, and to provide the address load signal during a first cycle of the second clock signal; and
      conversion logic coupled to the bus interface logic and the burst RAM, wherein the conversion logic asserts the address advance signal during clock edges of the second clock signal corresponding to the predetermined data rate, and negates the address advance signal otherwise.

2. The memory system of claim 1, wherein the memory array control logic includes a binary counter to increment the address provided to the memory array on clock edges of the second clock when the address advance signal is asserted and an address register to latch an address from the bus to the memory array on an edge of the second clock when the address load signal is asserted.

3. The memory system of claim 1, the computing device further containing at least one processor operating with a processor clock signal, wherein the second clock signal is essentially the processor clock signal.

4. The memory system of claim 3, wherein the frequency of the first clock signal is approximately half the frequency of the second clock signal.

5. A memory system for use in a computing device having a bus, the memory system providing data at a predetermined rate corresponding to a first clock signal, the memory system operating with a second, higher frequency clock signal, comprising:

a burst RAM, comprising:
  a memory array for receiving and providing data at the predetermined data rate; and
  memory array control means coupled to the memory array and capable of receiving an address load signal, an address advance signal and the second clock signal, for latching an address from the bus to the memory array on an edge of the second clock when the address load signal is asserted and for incrementing the address provided to the memory array on clock edges of the second clock when the address advance signal is asserted, the logic operating using the second clock signal; and a memory controller coupled to the burst RAM, comprising:
  means for detecting the start of a burst cycle on the bus and for providing the address load signal during a first cycle of the second clock signal; and
  means coupled to the burst cycle detecting means and the burst RAM for asserting the address advance signal during clock edges of the second clock signal corresponding to the predetermined data rate, and negating the address advance signal otherwise.

6. The memory system of claim 5, wherein the memory array control means comprises a binary counter for incrementing the address provided to the memory array on clock edges of the second clock when the address advance signal is asserted and an address register for latching an address from the bus to the memory array on an edge of the second clock when the address load signal is asserted.

7. The memory system of claim 5, the computing device further containing at least one processor operating with a processor clock signal, wherein the second clock signal is essentially the processor clock signal.

8. The memory system of claim 7, wherein the frequency of the first clock signal is approximately half the frequency of the second clock signal.

9. A computer system incorporating a memory system designed to provide data at a predetermined rate corresponding to a first clock signal, the memory system operating with a second, higher frequency clock signal, the computer system comprising:

a bus;

a processor coupled to the bus;

a burst RAM coupled to the bus, comprising:

a memory array adapted to receive and provide data at the predetermined data rate corresponding to the first clock signal; and
  memory array control logic coupled to the bus and the memory array and receiving an address load signal, an address advance signal and the second clock signal, the memory array control logic configured to latch an address from the bus to the memory array on an edge of the second clock when the address load signal is asserted, and to increment the address provided to the memory array on clock edges of the second clock when the address advance signal is asserted, the memory array control logic operating using the second clock signal;

a memory controller coupled to the bus and the burst RAM, comprising:
  bus interface logic coupled to the bus and configured to detect the start of a burst cycle on the bus, and to provide the address load signal during a first cycle of the second clock signal; and
  conversion logic coupled to the bus interface logic and the burst RAM, wherein the conversion logic asserts the address advance signal during clock edges of the second clock signal corresponding to the predetermined data rate, and negates the address advance signal otherwise; and a peripheral mass storage device coupled to the processor, the peripheral mass storage device adapted to provide data to the processor and the burst RAM.

10. The computer system of claim 9, wherein the memory array control logic includes a binary counter to increment the address provided to the memory array on clock edges of the second clock when the address advance signal is asserted and an address register to latch an address from the bus to the memory array on an edge of the second clock when the address load signal is asserted.

11. The computer system of claim 9, the processor operating with a processor clock signal, wherein the second clock signal is essentially the processor clock signal.

12. The computer system of claim 11, wherein the frequency of the first clock signal is approximately half the frequency of the second clock signal.

13. A method of retrieving data from a synchronous memory device, the method comprising the steps of:

providing a clock signal having periodic clock cycles at a first frequency;

generating a control signal which is synchronous with the clock signal, the control signal being asserted at a first time, remaining asserted for at least one clock cycle, and being deasserted at a second time;

applying the control signal to the memory device; and outputting data from the memory device in response to the control signal, wherein the data becomes valid at least two clock cycles after the first time and wherein the data signal becomes valid after the second time.

14. The method of claim 13 wherein the memory device comprises a burst mode SRAM.

15. The method of claim 13 wherein the control signal is generated by a cache controller.

16. The method of claim 13 wherein the data becomes valid about two clock cycles after the first time.

17. The method of claim 13 wherein the first frequency is at least 66 MHz.

18. A computer system comprising:

a bus;

a processor coupled to the bus, the processor operable in synchronization with a system clock which operates at a first frequency;

a controller with an input which receives the system clock the controller generating a control signal which is synchronous with the system clock signal the control signal being asserted at a first time, remaining asserted for at least one cycle of the system clock and being deasserted at a second time;

an external cache with a plurality of data lines coupled to the processor through a data bus portion of the bus, the external cache capable of outputting data at a rate no greater than a second frequency which is less than the first frequency, the external cache for outputting data in response to the control signal, wherein the data becomes valid at least two cycles of the system clock after the first time and wherein the data signal becomes valid after the second time; and system memory coupled to the bus.

19. The system of claim 18 wherein the first frequency is at least 66 MHz and the second frequency is at least 33 MHz.

20. The system of claim 18 wherein the processor, the external cache and the memory controller are separately coupled to a circuit board.

21. The system of claim 18 wherein the external cache comprises a burst SRAM.

22. A computer system comprising:

a processor coupled to a bus, the processor operable at a first frequency;

a burst SRAM cache with a plurality of data lines coupled to the processor through a data bus portion of the bus, the burst SRAM cache capable of outputting data at a rate no greater than a second frequency which is less than the first frequency the burst SRAM cache for outputting data in response to a control signal at the first frequency wherein the burst SRAM cache comprises:

a memory cell array; and memory array control logic coupled to the memory array and receiving an address load signal, an address advance signal and a clock signal at the first frequency, the memory array control logic configured to latch an address from the bus to the memory array on an edge of the clock signal when the address load signal is asserted, and to increment the address provided to the memory array on clock edges of the clock signal when the address advance signal is asserted, the memory array control logic operating using the clock signal, system memory coupled to the bus; and a memory controller for controlling transfer of data between the processor, the burst SRAM cache and the system memory.

23. The system of claim 18 wherein the first frequency is an integer factor of the second frequency.

24. The system of claim 23 wherein the first frequency is twice the second frequency.

* * * * *